US009070725B2

(12) United States Patent
Matsudo et al.

(10) Patent No.: US 9,070,725 B2
(45) Date of Patent: Jun. 30, 2015

(54) MEASURING APPARATUS AND PLASMA PROCESSING APPARATUS

(75) Inventors: Tatsuo Matsudo, Nirasaki (JP); Hidetoshi Kimura, Kurokawa-gun (JP)

(73) Assignee: TOKYO ELECTRON LIMITED (JP)

( * ) Notice: Subject to any disclaimer, the term of this patent is extended or adjusted under 35 U.S.C. 154(b) by 522 days.

(21) Appl. No.: 13/435,656

(22) Filed: Mar. 30, 2012

(65) Prior Publication Data

US 2012/0247669 A1    Oct. 4, 2012

Related U.S. Application Data

(60) Provisional application No. 61/537,718, filed on Sep. 22, 2011.

(30) Foreign Application Priority Data

Mar. 30, 2011    (JP) ................................. 2011-074979

(51) Int. Cl.
| C23C 16/00 | (2006.01) |
| C23F 1/00 | (2006.01) |
| H01L 21/67 | (2006.01) |
| G01K 5/50 | (2006.01) |
| G01K 11/00 | (2006.01) |
| H01J 37/32 | (2006.01) |

(52) U.S. Cl.
CPC ............ *H01L 21/67248* (2013.01); *G01K 5/50* (2013.01); *G01K 11/00* (2013.01); *H01J 37/32972* (2013.01)

(58) Field of Classification Search
CPC ............................................... H01L 21/67248
See application file for complete search history.

(56) References Cited

U.S. PATENT DOCUMENTS

| 6,744,505 | B1 * | 6/2004 | Wang et al. ................... 356/326 |
| 6,797,529 | B2 * | 9/2004 | Otsubo et al. ................... 438/14 |
| 6,999,169 | B2 * | 2/2006 | Sanpei et al. ................. 356/328 |
| 7,762,720 | B1 |  7/2010 | Zhu et al. |

(Continued)

FOREIGN PATENT DOCUMENTS

| JP | 01197617 | 8/1989 |
| JP | 2010-199526 | 9/2010 |

OTHER PUBLICATIONS

Yi-peng Liu et al., Grads parse algorithm for enhancing CCD resolution, Opto-Electronic Engineering, 2005, pp. 78-81.

(Continued)

*Primary Examiner* — Gordon R Baldwin
*Assistant Examiner* — Charlee Bennett
(74) *Attorney, Agent, or Firm* — Cantor Colburn LLP

(57) ABSTRACT

Provided a measuring apparatus includes a wavelength dispersion device which dispersed light reflected by one surface of an examination target having a thickness D and light reflected by a rear surface of the examination target, as incident light, a detector in which a plurality of photodetection elements receiving light dispersed by the wavelength dispersion device and detecting a power of the received light in are provided in an array shape, and a piezoelectric device which is attached to the detector to convert an applied voltage into a mechanical power, wherein the detector detects the power of the received light when the detector is shifted by the mechanical power converted by the piezoelectric device as much as d/m, where d is a width of each of the photodetection elements in an array direction and m is an integer equal to or greater than 2.

7 Claims, 9 Drawing Sheets

(56) References Cited

U.S. PATENT DOCUMENTS

2002/0011852 A1* 1/2002 Mandelis et al. ............. 324/752
2002/0020819 A1   2/2002 Wolleschensky et al.
2012/0327394 A1* 12/2012 Matsudo et al. ................ 356/43

OTHER PUBLICATIONS

USB2000 Miniature Fiber Optic Spectrometer, InternetArchive, Ocean Optics, Inc., Apr. 14, 2006.

* cited by examiner

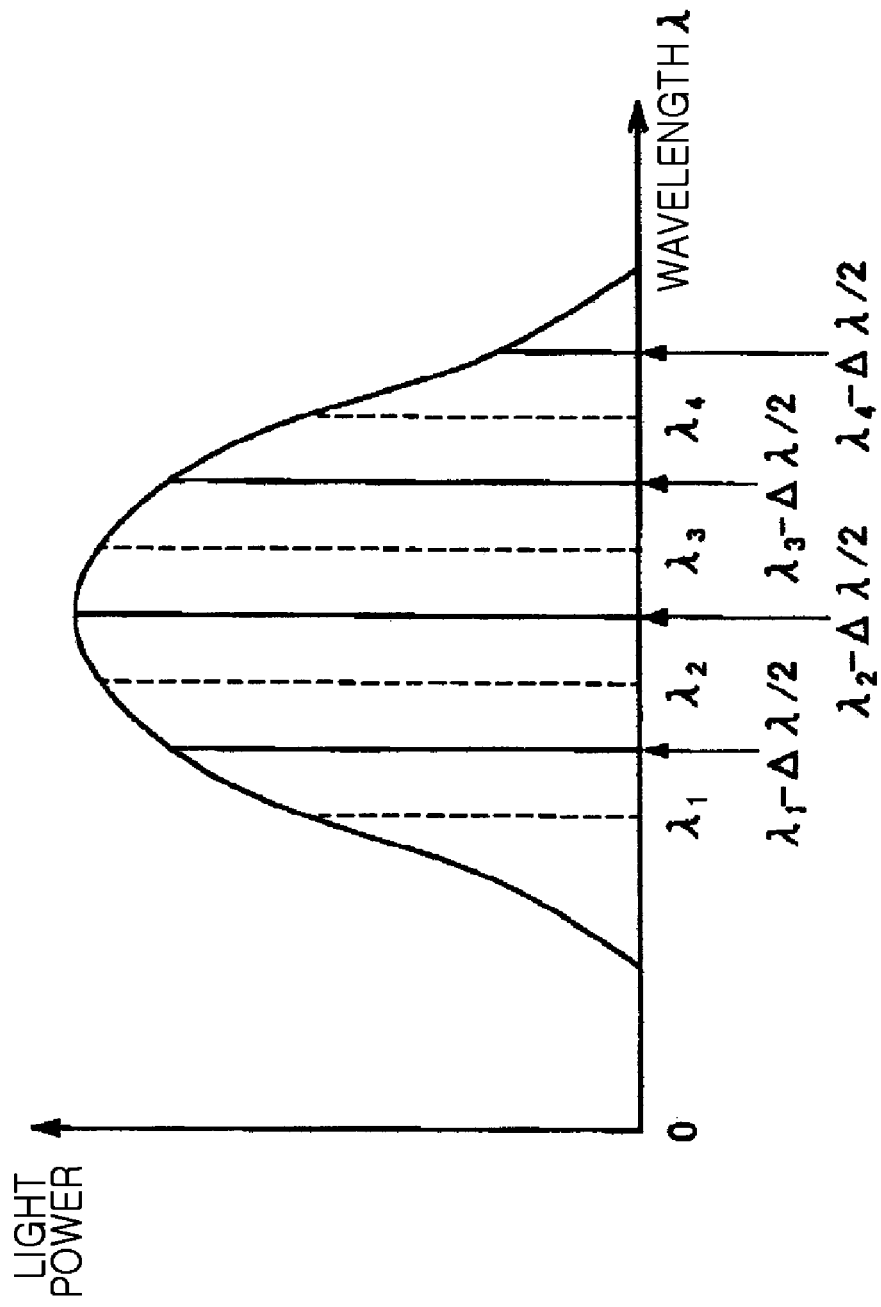

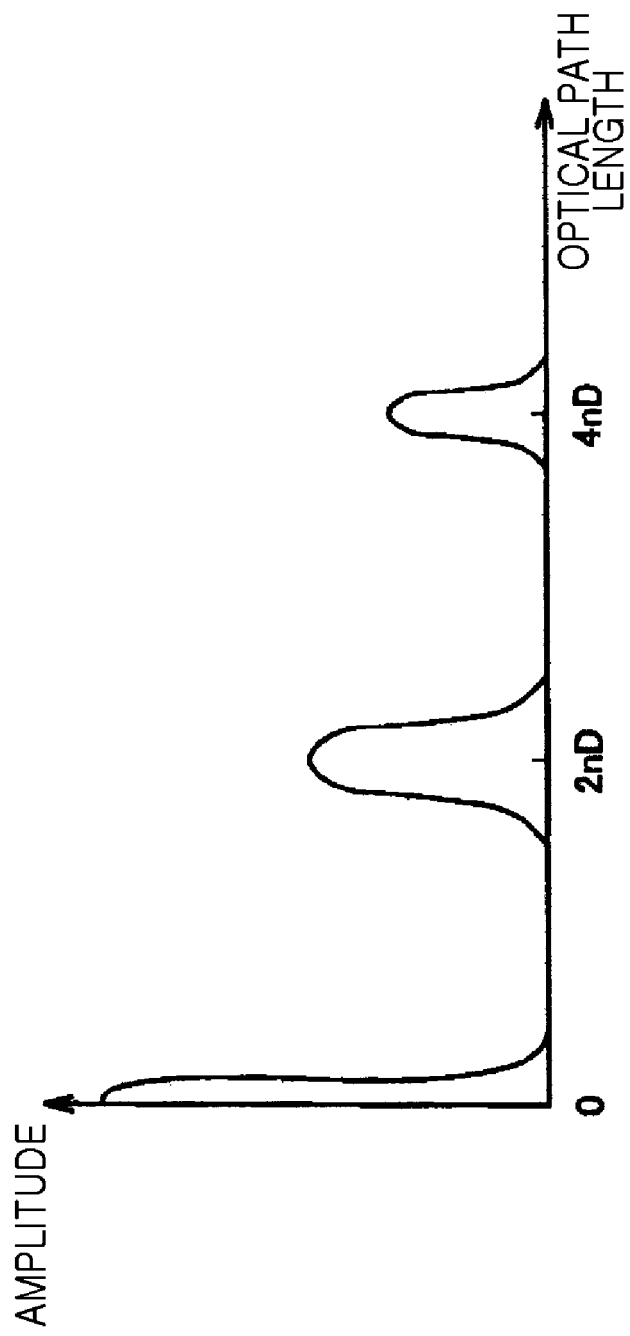

Comparative Example

MEASURING APPARATUS AND PLASMA PROCESSING APPARATUS

CROSS-REFERENCE TO RELATED PATENT APPLICATIONS

This application claims the benefit of Japanese Patent Application No. 2011-74979, filed on Mar. 30, 2011, in the Japanese Patent Office, and U.S. Patent Application No. 61/537,718 filed on Sep. 22, 2011 in the U.S. Patent and Trademark Office, the disclosure of which is incorporated herein in its entirety by reference.

BACKGROUND OF THE INVENTION

1. Field of the Invention

The present invention relates to a measuring apparatus and a plasma processing apparatus, and more particularly, to an apparatus for optically measuring an examination target.

2. Description of the Related Art

When etching or film formation is performed on, for example, a semiconductor wafer (hereinafter, referred to as a wafer), controlling of a temperature of the wafer is relevant to a film forming rate or an etching rate of the wafer, thereby affecting features of a film or a shape of a hole formed in the wafer. Therefore, it is important to improve accuracy of controlling the temperature of the wafer in order to improve processing accuracy of the wafer, yield, and productivity of the wafer.

Thus, a method of measuring a temperature of a wafer by using a fluorescent thermometer or a resistance thermometer for measuring a temperature of a rear surface of the wafer, or the like has been conventionally suggested. Patent Reference 1 discloses an apparatus for measuring a temperature of a wafer based on an interference state between measuring light and reference light, including a light source, a unit for dividing light emitted from the light source into the measuring light and the reference light, and a unit for reflecting the divided reference light and changing an optical path length of the reflected reference light, and a photodetector for detecting an interference state between the measuring light reflected by the wafer and the reference light, by irradiating the wafer with the measuring light.

On the other hand, by using a spectroscope using a charge coupled device (CCD) array or a photodiode array as a detector, spectrum data may be acquired instantly by photodetection elements arranged in an array shape. Since the spectrum data represent characteristics of light incident to the spectroscope, the temperature of the wafer may be measured by using the spectrum data.

However, in the spectroscope using a CCD array or a photodiode array, a wavelength resolution power or the sampling number in wavelength domain is determined according to the number of elements, and thus it is physically impossible to increase the wavelength resolution power to be higher than the number of elements. In addition, the wavelength resolution power is limited to 3648 in a visible region and to 512 to 1024 in an infrared region, and thus the wavelength resolution power cannot be increased more than the above limitations. Thus, spectrum of a high resolution cannot be implemented when using, in particular, infrared rays, compared with visible rays.

On the other hand, there is a correlation between the wavelength resolution power and a thickness of an examination target that can be measured, and the lower the wavelength resolution power becomes, the more the thickness of the measurable examination target is limited. Therefore, up to now, a thickness of the examination target that can be measured by using a general CCD array or a photodiode array is limited to be very thin. For example, in a plasma processing apparatus, a thickness of a wafer may be measured; however, a thick member having a thickness to a certain degree, such as a focus ring, or the like cannot be measured.

3. Prior Art Reference (Patent Reference 1) Japanese Laid-open Patent Publication No. 2010-199526

SUMMARY OF THE INVENTION

The present invention provides a measuring apparatus and a plasma processing apparatus, capable of increasing a thickness range of a measurable examination target by increasing a wavelength resolution power.

According to an aspect of the present invention, there is provided a measuring apparatus including: a wavelength dispersion device which disperses light reflected by one surface of an examination target having a thickness and light reflected by a rear surface of the examination target, as incident light; a detector in which a plurality of photodetection elements receiving light dispersed by the wavelength dispersion device and detecting a power of the received light in are provided in an array shape; and a piezoelectric device which is attached to the detector to convert an applied voltage into a mechanical power, wherein the detector detects the power of the received light when the detector is shifted by the power converted by the piezoelectric device as much as d/m, where d is a width of each of the photodetection elements in an array direction and m is an integer equal to or greater than 2.

In the measuring apparatus according to the aspect of the present invention, the measuring unit may measure the temperature of the examination target when a thickness of the examination target is less than a maximum value ($X_{max}$) represented by following equation, $$x_{max} = \frac{3\lambda_0^2}{2\sqrt{\ln 2} \cdot n_{ave}} \cdot \frac{1}{\Delta w / N} \qquad (1)$$

where $\lambda_0^2$ denotes a center wavelength of a light source, $n_{ave}$ denotes a refractive index of the examination target, $\Delta w$ denotes a wavelength span of the measuring apparatus, and N denotes the number of photodetection elements or the sampling number.

According to another aspect of the present invention, there is provided a plasma processing apparatus including: a chamber which performs a plasma process of a processing target therein; a susceptor on which the processing target is placed in the chamber; and a measuring apparatus which measures a temperature of the processing target placed on the susceptor, wherein the measuring apparatus includes: a wavelength dispersion device which disperses light reflected by one surface of an processing target having a thickness and light reflected by a rear surface of the processing target, as incident light; a detector in which a plurality of photodetection elements receiving light dispersed by the wavelength dispersion device and detecting a power of the received light in are provided in an array shape; and a piezoelectric device which is attached to the detector to convert an applied voltage into a mechanical power; wherein the detector detects the power of the received light when the detector is shifted as much as d/m (where d denotes a width of each of the photodetection devices in an array direction and m is an integer equal to or greater than 2) by the power converted by the piezoelectric device in the array direction.

BRIEF DESCRIPTION OF THE DRAWINGS

The above and other features and advantages of the present invention will become more apparent by describing in detail exemplary embodiments thereof with reference to the attached drawings in which:

FIGS. 4A through 4C are diagrams for explaining a method of measuring a temperature by using the measuring apparatus, according to an embodiment of the present invention;

DETAILED DESCRIPTION OF THE INVENTION

Figure 1:
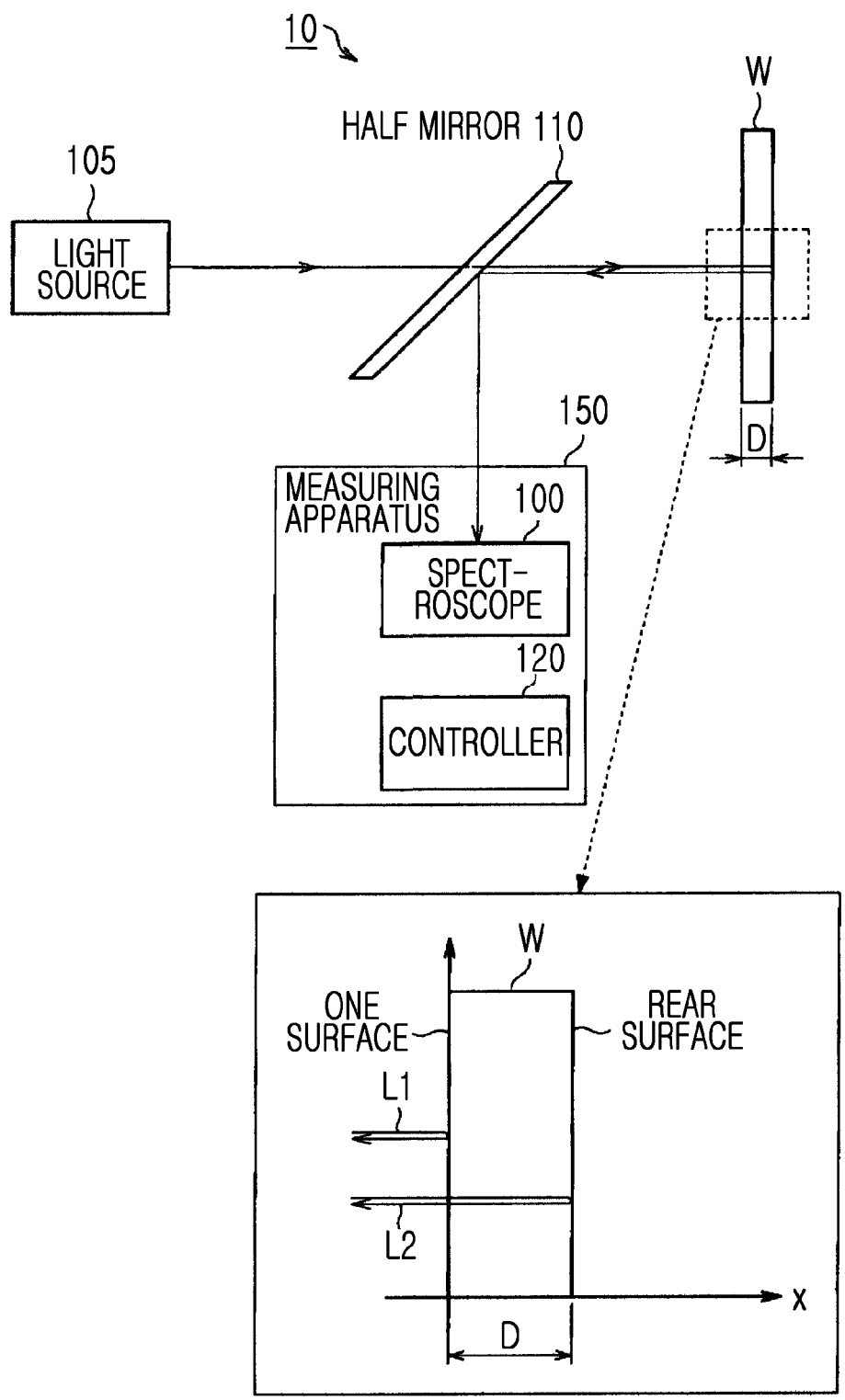
FIG. 1 is a block diagram showing an entire measuring system according to an embodiment of the present invention.

The attached drawings for illustrating exemplary embodiments of the present invention are referred to in order to gain a sufficient understanding of the present invention, the merits thereof, and the objectives accomplished by the implementation of the present invention. Hereinafter, the present invention will be described in detail by explaining exemplary embodiments of the invention with reference to the attached drawings. Like reference numerals in the drawings denote like elements and a repeated explanation thereof will not be given.

Figure 6:
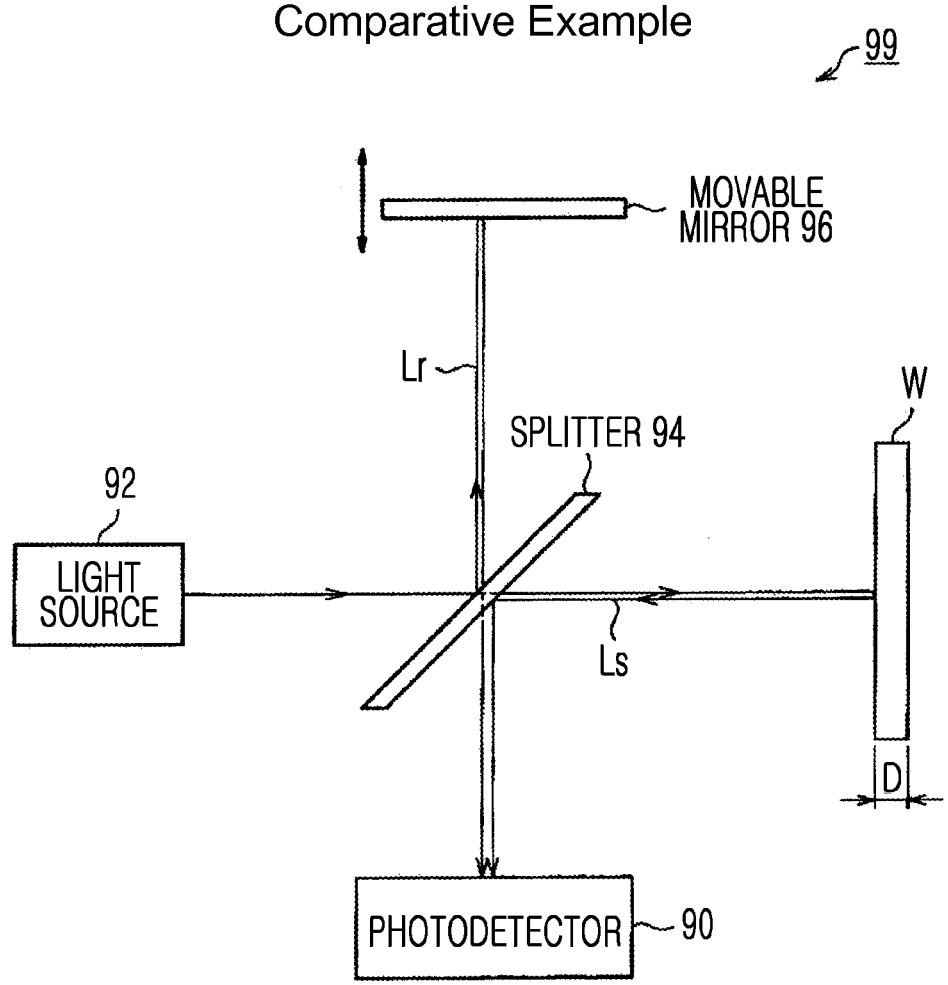
FIG. 6 is a diagram showing a measuring system using a movable mirror according to a comparative example.

To begin with, a measuring system using a movable mirror will be described with reference to FIG. 6, as a comparative example with a measuring system according to an embodiment of the present invention. In the measuring system 99 according to the comparative example, a temperature measuring method in consideration of a time domain is provided.

Figure 7:
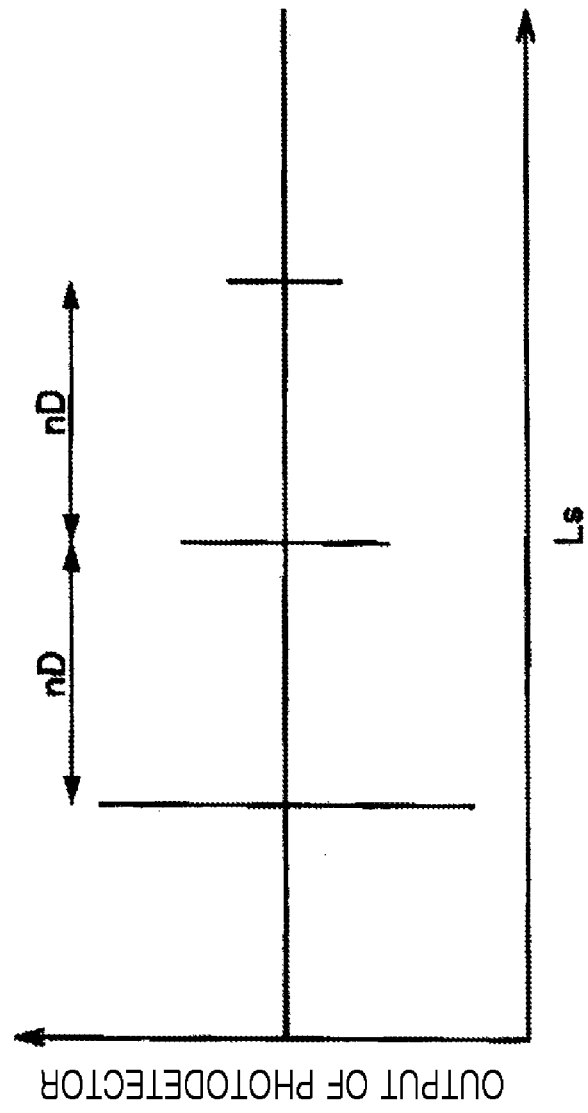
FIG. 7 is a diagram for explaining an example of an interference waveform according to the comparative example.

First, light output from a light source 92 is split into measuring light Ls and reference light Lr by a splitter 94. The reference light Lr is reflected by a movable mirror 96. The measuring light Ls is emitted onto a wafer W and reflected by the wafer W, and is also reflected by the splitter 94. A photodiode (photodetector) 90 receives the measuring light Ls reflected by the wafer W and the reference light Lr reflected by the movable mirror 96 as incident light. The movable mirror 96 changes an optical path length of the reflected reference light Lr while moving in an up-and-down direction. When a distance from the splitter 94 to the movable mirror 96 and a distance from the splitter 94 to the wafer W are the same as each other, interference occurs. The variation in light power obtained in the photodiode 90 with respect to a moving amount of the movable mirror 96 is monitored. FIG. 7 shows a monitoring result, that is, an output of the photodiode (photodetector) 90 with respect to a length of the measuring light Ls. In FIG. 7, an interference waveform is obtained by a period of nD. Here, an optical path length of the reference light Lr is changed by moving the movable mirror 96, and thus the measuring light Ls and the reference light Lr reflected by one surface and the rear surface of the wafer W interfere with each other. As such, a strong interference occurs on portions where optical path lengths of the measuring light Ls and the reference light Lr coincide with each other, thereby actually reducing interferences in other portions. Thus, by using the above characteristic, an interval nD between the interference on one surface of the wafer W and the interference on the rear surface of the wafer W is detected and the temperature of the wafer W is measured based on the detected result.

However, in the above comparative example, the movable mirror 96 is slowly moved in order to restrain vibrations caused by the movement. Thus, the sampling number within a measurement time period decreases and thus an interval of measurement becomes longer. In addition, in the above measuring apparatus, the optical path length is maintained in an order of $10^{-1}$ mm, and thus, the system becomes larger.

On the other hand, in the measuring system according to an embodiment of the present invention, there is no movable mirror as shown in FIG. 1. Therefore, there is no problem caused by vibrations of the movable mirror. In addition, as shown in an expanded view on a lower portion of FIG. 1, the measuring system according to the present embodiment measures interference between light L1 reflected by one surface of a wafer W and light L2 reflected by a rear surface of the wafer W, unlike the comparative example in which the interference between the optical path lengths is measured. Therefore, according to the measuring system of the present embodiment, there is no misalignment of the optical path length due to the movable mirror, and thus lowering of the temperature measuring accuracy does not occur. Accordingly, the measuring apparatus may be made compact, thereby reducing manufacturing costs.

On the other hand, the measuring apparatus of the present embodiment requires a spectroscope having a detector in an array shape. For example, when a spectroscope using a charge coupled device (CCD) array or a photodiode array as a detector is used, spectrum data may be instantly acquired by photodetection elements arranged in an array.

However, by using the spectroscope using the CCD array or the photodiode array, a wavelength resolution power or the sampling number in a wavelength domain is defined by the number of photodetection elements, and thus it is physically impossible to increase the wavelength resolution power to be greater than the number of elements.

On the other hand, there is a correlation between the wavelength resolution power and a thickness of an examination target that can be measurable, and the lower the wavelength resolution power becomes, the more the thickness of the measurable examination target is limited. Therefore, up to now, the examination target that may be measured by the general CCD array or the photodiode array is limited to be very thin. For example, in a plasma processing apparatus, a thin member having a thickness of a wafer may be measured; however, a thick member having a thickness to some extent such as a focus ring or the like cannot be measured.

[Configuration of Measuring System]

In this regard, according to the measuring system of the present embodiment, a wavelength resolution power of a detector of an array type is increased to allow a member having a thickness to some extent to be measured. Hereinafter, the measuring system and a measuring apparatus provided in the measuring system according to the present embodiment will be described as follows.

In the measuring system of the present embodiment, a temperature measuring method in consideration of frequency domain is provided. FIG. 1 is a block diagram of an entire measuring system 10 according to the present embodiment, and FIG. 2 is a block diagram showing a measuring apparatus 150 according to the present embodiment.

The measuring system 10 includes a light source 105, a half mirror 110, and a measuring apparatus 150. The measuring apparatus 150 includes a spectroscope 100 and a controller 120. Here, the measuring apparatus 150 is used as a non-contact thermometer for measuring a temperature of an examination target; however, the present invention is not limited thereto, that is, the measuring apparatus 150 may be used to measure a state of the examination target based on characteristics of measured light.

Light output from the light source 105 transmits through the half mirror 110, and is emitted to a wafer W that is the examination target and reflected by the wafer W. Reflected light may include reflected light L1 reflected by one surface of the wafer W and reflected light L2 reflected by a rear surface of the wafer W. The reflected light L1 and the reflected light L2 are mismatched with each other by a double length (2D) to a thickness D of the wafer W. The reflected lights L1 and L2 are incident to the spectroscope 100 after being reflected by the half mirror 110.

Figure 2:
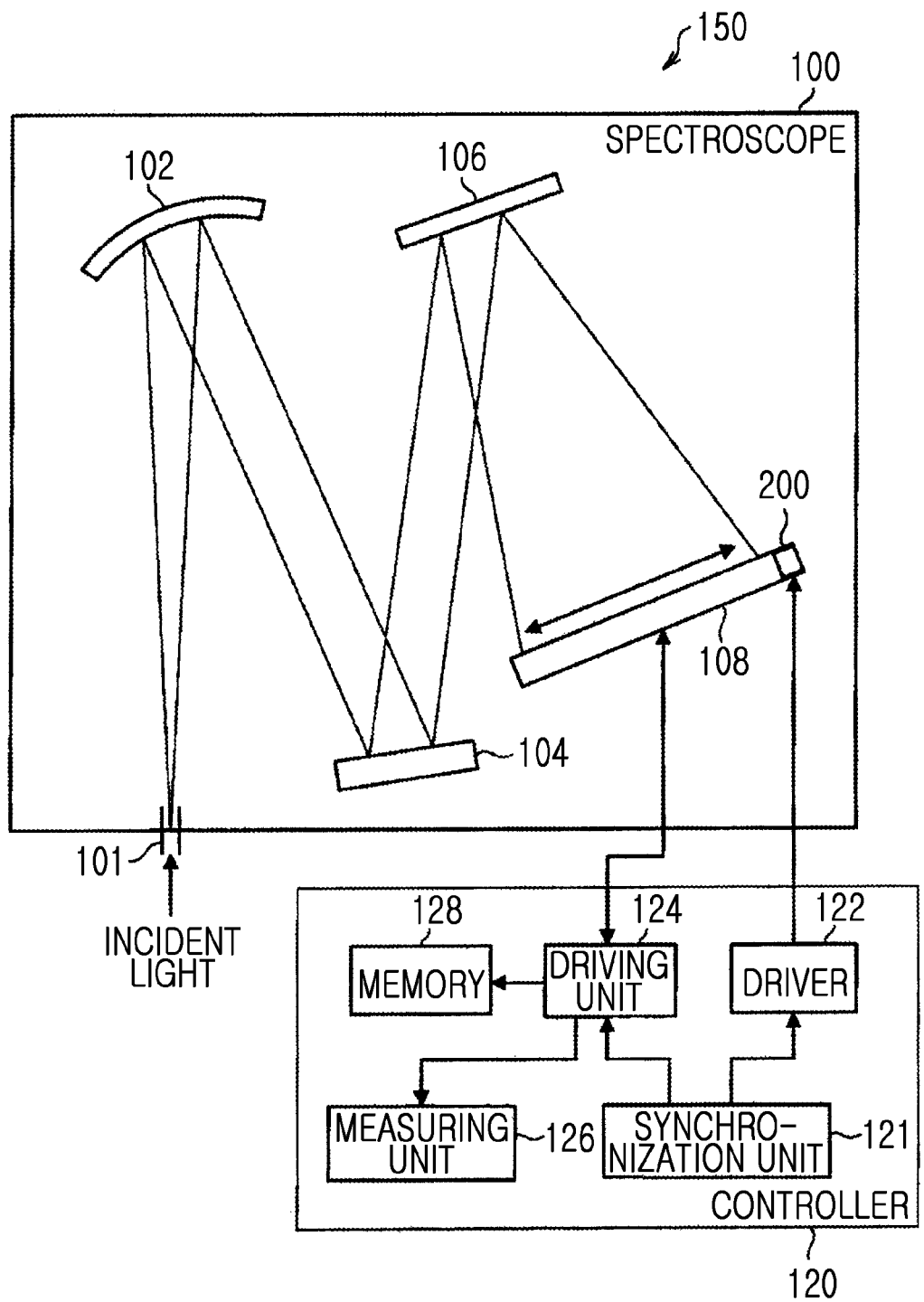
FIG. 2 is a schematic block diagram of a measuring apparatus according to an embodiment of the present invention.

As shown in FIG. 2, the spectroscope 100 is a Czerny-Turner type spectroscope that disperses measuring light by using a wavelength dispersing element into wavelength units, and calculates power of light existing in an arbitrary wavelength width to measure characteristics of the measuring light from the calculated light power.

The spectroscope 100 includes an input slit 101, a mirror 102, a diffraction grating 104, a mirror 106, and a photo-diode array 108. The mirror 102 and the mirror 106 are provided so as to reflect incident light toward desired directions. The light reflected by the mirror 106 is incident to the photodiode array 108.

Light incident from the input slit 101 is reflected by the mirror 102 with a concave surface and irradiated to the diffraction grating 104. The diffraction grating 104 diffracts the light reflected by the surface of the wafer W having a thickness D and the light reflected by the rear surface of the wafer W, as incident light. Light of a certain wavelength in the reflected light and the diffracted light is reflected by the mirror 106 having a plane surface and is incident to the photodiode array 108.

The photodiode array 108 detects power of the incident light.

The diffraction grating 104 is an example of a wavelength dispersion device for diffracting the light reflected by the surface of the wafer W having the thickness D and the light reflected by the rear surface of the wafer W, as incident light. Another example of the wavelength dispersion device may be a prism.

The photodiode array 108 is an example of a detector, in which a plurality of photodetection elements (photodiodes) for receiving the diffracted light and detecting the power of the received light are provided in an array shape. The photodiode array 108 is formed of photodetectors (PDs) using Si photodiodes, InGaAs photodiodes, Ge photodiodes, or the like in an array shape. In the photodiode array 108 shown in FIG. 3, twelve rectangular-shaped photodiodes 108a are arranged in an array direction; however, a plurality of photodiodes 108a of spot shape may be arranged in an array direction. Another example of the detector may be a CCD array. However, the present invention is not limited to the above examples, and all kinds of detectors having photodetection elements of an array shape may be used.

Each of the photodetection elements in the photodiode array 108 generates electric current (photocurrent) according to the power of the received light, and outputs the photocurrent as a detection result of the spectroscope. In addition, a certain wavelength is allocated to each of the elements in advance. The certain wavelength allocated to each of the elements corresponds to a receiving location of the photodiode array 108, to which the light is diffracted by the diffraction grating 104 according to each wavelength and then incident to the photodiode array 108. Therefore, each of the elements generates the electric current (photocurrent) according to the power of the light of a certain wavelength allocated to each of the elements.

A piezoelectric device 200 is attached to an end portion of the photodiode array 108. The piezoelectric device 200 is a device in which a piezoelectric material is inserted between two electrodes, and when a desired voltage is applied to the electrodes, the voltage is converted into mechanical power. The piezoelectric device 200 vibrates the photodiode array 108 as much as a predetermined amount at a predetermined timing.

The controller 120 drives each of components in the spectroscope 120, and measures a temperature of the examination target based on the power of light of each wavelength detected by the spectroscope 100. The controller 120 includes a synchronization unit 121, a driver 122, a driving unit 124, a measuring unit 126, and a memory 128. The synchronization unit 121 outputs a synchronization signal. The driver 122 applies a desired voltage to the piezoelectric device 200 according to the synchronization signal.

Figure 3:
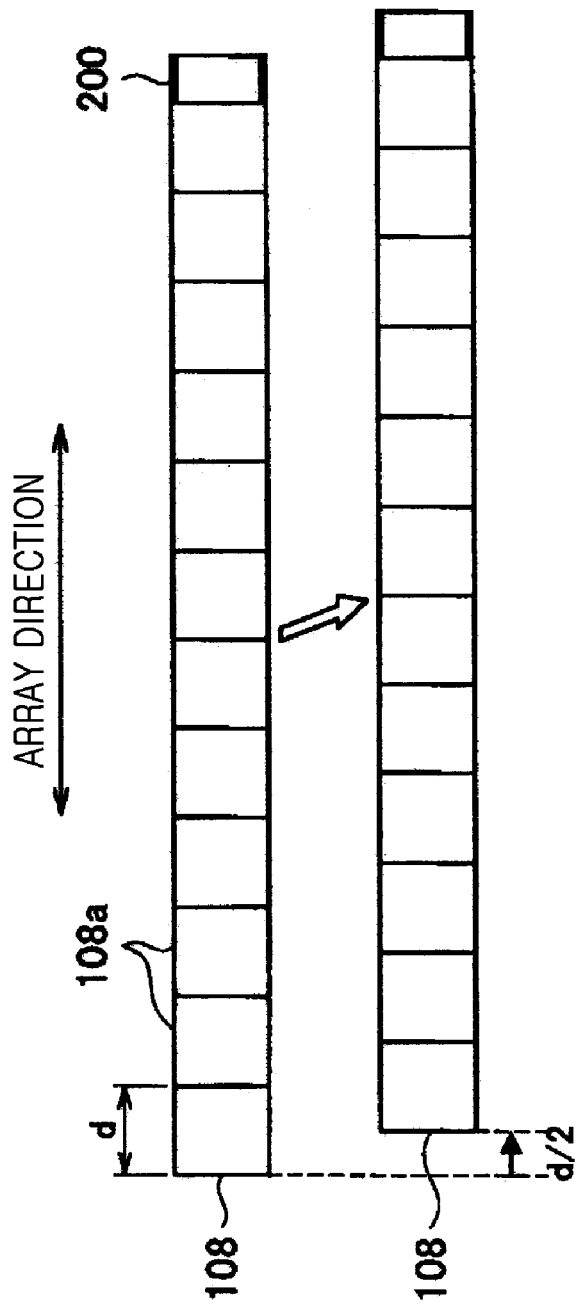
FIG. 3 is a diagram for explaining a shift of a photodiode array according to an embodiment of the present invention.

FIG. 3 is a diagram schematically showing a state of the photodiode array 108 when a desired voltage is applied to the piezoelectric device 200. A direction in which the photodiodes 108a are arranged in an array shape (left-and-right direction in FIG. 3) is referred to as an array direction. Here, a width of the photodiode 108a in the array direction is denoted as d. The piezoelectric device 200 converts the applied voltage into the mechanical power, and moves the photodiode array 108 in the array direction. For example, in FIG. 3, the photodiode array 108 is moved as much as d/2 from a state of shift 0 in the array direction by the mechanical power applied from the piezoelectric device 200.

The driving unit 124 sequentially connects to each of the photodiodes 108a in the photodiode array 108 according to the synchronization signal output from the synchronization unit 121 to convert a detected signal (photocurrent) of the light power detected by each of the photodiodes 108a into a desired electric signal and output the converted electric signal.

The measuring unit 126 measures characteristics of the incident light based on the detected power of light. In the present embodiment, the measuring unit 126 measures a temperature of the wafer W that is the examination target based on a frequency analysis of a fast Fourier transform (FFT) method of the detected light power. The measurement result is stored in the memory 128. Hereinafter, the temperature measuring method will be described in more detail.

The detection result of the photodiode array 108 is obtained as an optical spectrum (light power) by plotting light power (light intensity) as a function of wavelength ($\lambda$) as shown in FIG. 4A.

FIG. 4A is a graph obtained by simplifying spectrum data detected by each of the elements at a location of the photodiode array 108 of an upper portion in FIG. 3 (shift 0) and spectrum data detected by each of the photodiodes 108a at a location of the photodiode array 108 of a lower portion in FIG. 3 (shift d/2).

In FIG. 4A, light powers detected by four photodiodes 108a are shown. At the shift 0, light powers of wavelengths $\lambda_1, \lambda_2, \lambda_3,$ and $\lambda_4$ are detected by the four photodiodes 108a.

At the location of the photodiode array 108 shown in the lower portion of FIG. 3 (shift d/2), the four photodiodes 108a detect light powers of wavelengths $\lambda_1-\Delta\lambda/2$, $\lambda_2-\Delta\lambda/2$, $\lambda_3-\Delta\lambda/2$, and $\lambda_4-\Delta\lambda/2$. That is, if the photodiode array 108 is shifted as much as d/2, 2N numbers of spectrum data may be sampled by using N number of elements in the photodiode array 108. This shows the same effect as that when the wavelength resolution power is twice the number of elements.

When frequency analysis is performed by a fast Fourier transform (FFT) method of the spectrum data, of which the wavelength resolution power increases twice, as shown in FIG. 4B, an optical spectrum of an amplitude of light is output at locations that are integer number (n) times (n is an integer equal to or greater than 1) a round optical path length (2D) in silicon between the reflected light L1 reflected by one surface of the wafer W having the thickness D and the reflected light L2 reflected by the rear surface of the wafer W.

Figure 4C:
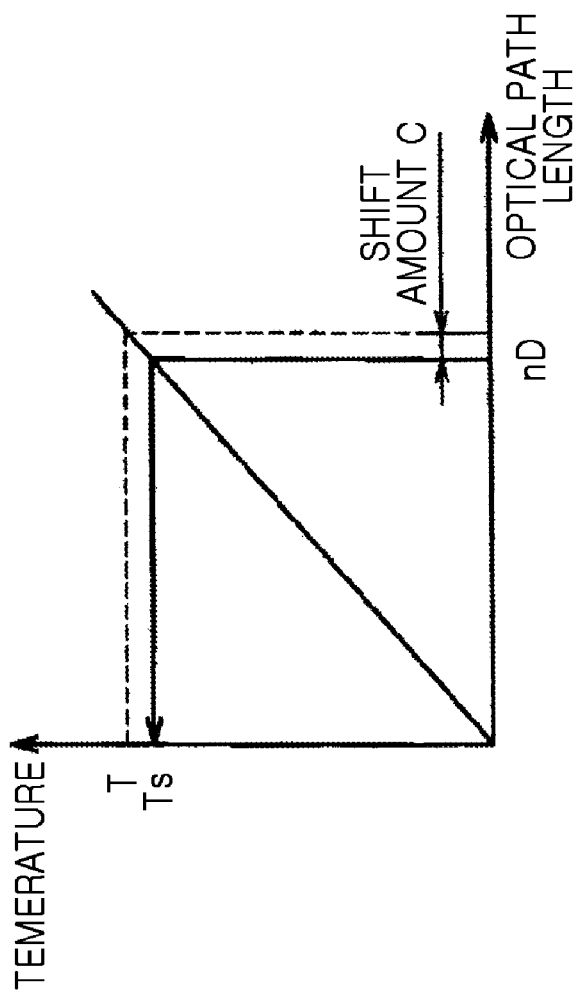

As shown in FIG. 4C, a relation between the integer number (n) times the thickness D of the wafer W and a temperature Ts is calculated in advance. Here, when the wafer W is heated, the thickness D of the wafer W increases due to thermal expansion and a refractive index also increases. Therefore, when the temperature rises, the multiple lengths (nD) that is the integer number (n) times the one way optical path length D (which is equal to thickness D) in the silicon is shifted. The temperature Ts is detected from a shift amount C of the multiple nD. As such, the temperature of the wafer W can be measured from each optical spectrum obtained through the FFT of the spectrum data.

In addition, functions of the driving unit 124 and the measuring unit 126 may be executed when, for example, a central processing unit (CPU) may operate according to programs accommodated in the memory 128. The programs may be provided in a recording medium and then read into the memory 128, otherwise may be downloaded from a network (not shown) and accommodated in the memory 128. In addition, a digital signal processor (DSP) may be used to execute functions of the components, instead of using the CPU. The memory 128 may be realized as a random access memory (RAM) or a read only memory (ROM) using, for example, a semiconductor memory, a magnetic disk, or an optical disk. In addition, functions of the driving unit 124 and the measuring unit 126 may be executed by using software or by operating hardware.

[Measurable Thickness]

A thickness of an examination target that can be measured by using the measuring apparatus 150 described above will be described as follows. A maximum value ($X_{max}$) of the thickness of the examination target achieved by the frequency analysis of the FFT method can be calculated as follows.

Following equation is obtained from a relation between time and frequency in the FFT.

$$\Delta\tau = 2\pi/\Delta w$$

Here, when w is represented by the wavelength $\lambda$ as follows.

$$w = 2\pi\nu = 2\pi c/\lambda$$

$$\Delta w = -2\pi c(\Delta\lambda/\lambda^2)$$

A distance $\Delta x'$ of moving in a sample having a refractive index $n_{ave}$ for a time $\Delta\tau$ can be represented by following equation.

$$\Delta x' = (c/n_{ave}) \times \Delta\tau = \lambda^2/(n_{ave}\Delta\lambda)$$

A moving distance of light reflected by a rear surface of the sample in the sample is $\Delta x' = 2\Delta x$, because the moving distance of the light reflected by the rear surface is round the thickness.

From the above equations, the distance $\Delta x$ after the FFT can be represented as follows.

$$\Delta x = \lambda^2/(2n_{ave}\Delta\lambda)$$

In addition, the maximum thickness $X_{max}$ of the examination target can be represented as follows from Nyquist theory.

$$X_{max} = (N/2) \times \Delta x = (\lambda^2/4n_{ave}\Delta\lambda) \times N$$

Next, it is considered how values of $X_{max}$ and $\Delta x$ might be from the real measurement result in a case where the measurable wavelength band of the detector of the array shape is finite. When a calculation system of Gaussian is used, a width where Gaussian becomes 1/e is a reference. In a case where ends of Gaussian can be measured exactly, half width of 1/e of Gaussian in, for example, the light source spectrum is $\Delta\lambda/\sqrt{(\ln 2)}$. Here, a width of $3 \times 1/e$ is a sensed width (half width of $6 \times 1/e$).

When a sensed wavelength band is $\Delta w$ and the sampling number is N, the wavelength resolution power can be represented as $\Delta w/N$.

In case of $\Delta w = 6 \times 1/e = 6\sigma'$ half width, following equations can be obtained when the above equation about $X_{max}$ is satisfied.

$$\Delta w/N = 6\sigma'/N'$$

$$N' = 6\sigma N/\Delta w$$

When N' is substituted in the above equation about $X_{max}$, following equations are obtained.

$$x_{max} = \frac{1}{4n_{ave}} \frac{\lambda_0^2}{\Delta\lambda} N' = \frac{1}{4n_{ave}} \frac{\lambda_0^2}{\Delta\lambda} \frac{6\sigma'}{\Delta w} N \quad (2)$$

$$S(\lambda) = \frac{1}{\Delta\lambda} \sqrt{\frac{\ln 2}{\pi}} \exp\left[-\left(\frac{\lambda - \lambda_0}{\Delta\lambda}\right)^2 \cdot \ln 2\right] \quad (3)$$

$$\Delta\lambda: HWHM \text{ of Source Spectrum (nm)} \quad (4)$$

$$\sigma' = \frac{\Delta\lambda}{\sqrt{\ln 2}} \quad (5)$$

$$\begin{aligned}
x_{max} &= \frac{1}{4n_{ave}} \frac{\lambda_0^2}{\Delta\lambda} \frac{6\sigma'}{\Delta w} N' \\
&= \frac{1}{4n_{ave}} \frac{\lambda_0^2}{\Delta\lambda} \frac{N}{\Delta w} \cdot 6 \cdot \frac{\Delta\lambda}{\sqrt{\ln 2}} \\
&= \frac{3\lambda_0^2}{2\sqrt{\ln 2} \cdot n_{ave}} \cdot \frac{N}{\Delta w} \\
&= \frac{3\lambda_0^2}{2\sqrt{\ln 2} \cdot n_{ave}} \cdot \frac{1}{\Delta w/N}
\end{aligned} \quad (6)$$

where $\lambda_0^2$ denotes a center wavelength of the light source, $n_{ave}$ denotes a refractive index of the examination target, $\Delta w$ denotes a wavelength span of the measuring apparatus 150, and N denotes the number of photodetection elements (the sampling number).

$$\Delta x = \frac{3\lambda_0^2}{\sqrt{\ln 2} \cdot n_{ave}} \cdot \frac{1}{\Delta w} \quad (7)$$

According to the above equations about $X_{max}$, it may be identified that a thick examination target can be measured when the wavelength resolution power that is represented as $\Delta w/N$ is high. In more detail, following facts are considered.

1. Since the greater the measuring span $\Delta w$ is, the less $\Delta x$ is, accuracy of peak locations may be improved.
2. When the number N of the samples in the measuring span $\Delta w$ is increased, the thick sample can be measured.

However, the number of elements in the CCD array or the photodiode array is 1024 at the maximum within a wavelength band range of 1300 nm to 1500 nm. Thus, if the value of $\Delta w$ is too large, the number of elements is reduced and the wavelength resolution power degrades, and thus, a lot of noise is induced in a signal after the FFT analysis.

Therefore, in order to satisfy the above conditions, an optical spectrum analysis may be used or a wavelength scanning method is used. In the frequency analysis of the FFT method, the light source is not necessarily low coherence.

As described above, there is a relationship between the wavelength resolution power and the measurable thickness of the examination target, and thus the lower the wavelength resolution power becomes, the more the measurable thickness of the examination target is limited. Therefore, up to now, the thickness of the examination target that can be measured by the general CCD array or the photodiode array is limited to be very thin. For example, in a plasma processing apparatus, the thin member having thickness of the wafer can be measured; however, the thick member such as a focus ring and the like having a thickness to some degree cannot be measured.

In contrast, in the measuring apparatus 150 according to the present embodiment, the photodiode array 108 is shifted to improve the wavelength resolution power. Therefore, according to the measuring apparatus 150 of the present embodiment, the thick member such as the focus ring, an upper electrode (silicon electrode), or the like having a thickness to some degree can be measured, as well as the wafer provided in a plasma processing apparatus that will be described later.

[Plasma Processing Apparatus Adopting Measuring System]

Last, a plasma processing apparatus including a measuring system 10 according to an embodiment of the present invention will be described with reference to FIG. 5.

Figure 5:
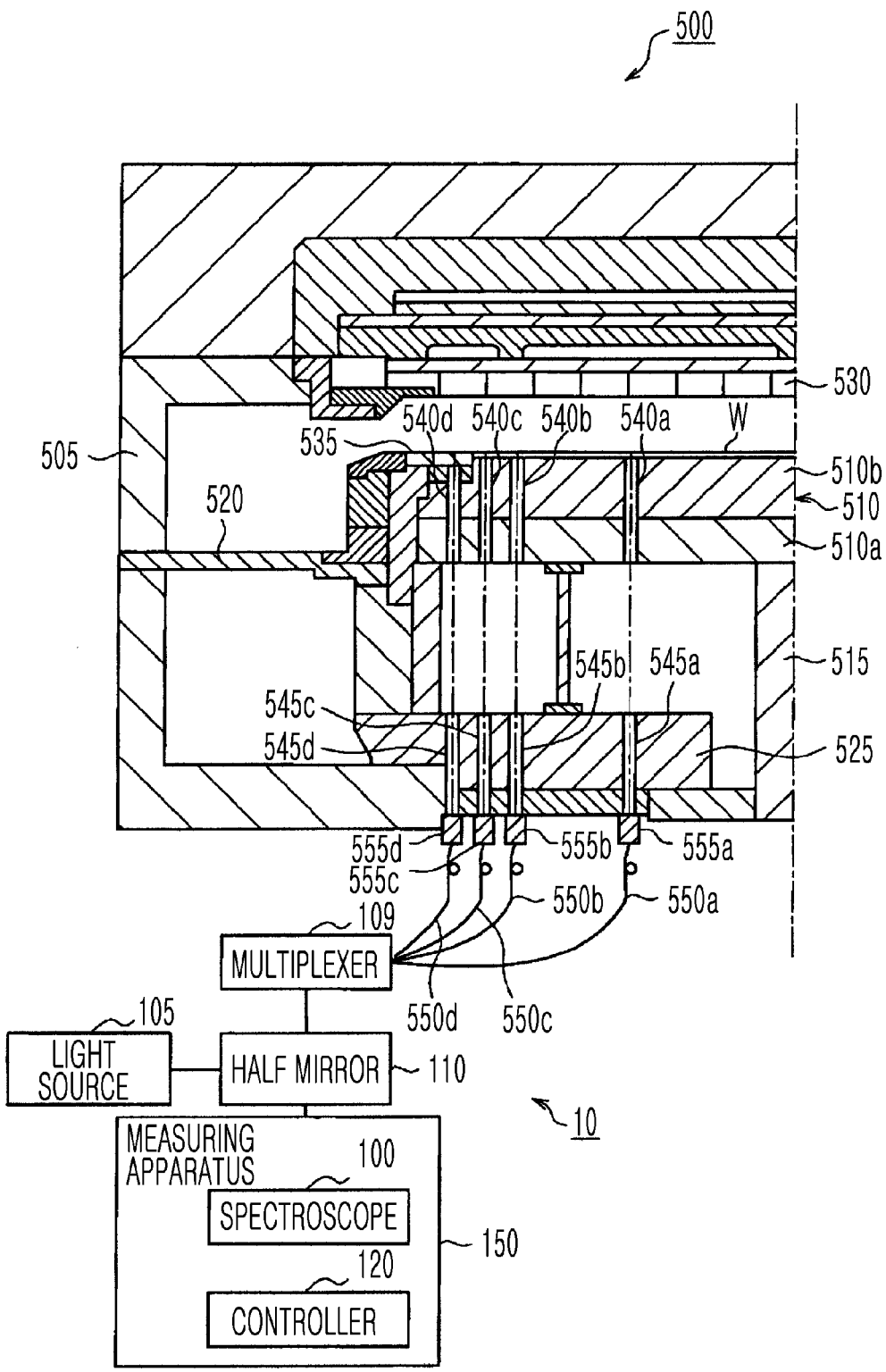
FIG. 5 is a longitudinal sectional view of a plasma processing apparatus including a measuring apparatus according to an embodiment of the present invention.

FIG. 5 is a left longitudinal sectional view of a plasma processing apparatus 500 including the measuring system 10. The plasma processing apparatus 500 includes a vacuum chamber 505 receiving a wafer W for processing the wafer W by using plasma. A susceptor 510 on which the wafer W is placed is provided in the vacuum chamber 505. The susceptor 510 includes a radio frequency (RF) plate 510a formed of a conductive material and to which a RF electric power is applied, and an electrostatic chuck mechanism 510b provided on the RF plate 510a for adsorbing the wafer W. A power feed rod 515 that is electrically connected to a RF power source (not shown) is connected to a center portion of the RF plate 510a.

A baffle plate 520 formed as a circular shape is provided around the susceptor 510 for surrounding the susceptor 510. In addition, a base plate 525 is provided on a bottom portion of the vacuum chamber 505, and a gap is formed between the RF plate 510a and the base plate 525.

An opposite electrode 530 is provided on an upper portion of the susceptor 510 so as to face the susceptor 510 with a gap therebetween. The opposite electrode 530 is formed as a shower head, and supply a predetermined processing gas in a shower type to the wafer W that is placed on the susceptor 510. The opposite electrode 530 is maintained at a ground potential or is applied by a RF electric power. A focus ring 535 is provided around the wafer W on the susceptor 510. The focus ring 535 improves a surface uniformity of a plasma process on the wafer W.

Four temperature measuring windows 540a through 540d are formed in the susceptor 510. The temperature measuring windows 540a through 540d are optically communicated and air-tightly sealed such that measuring light may transmit through upper and lower surfaces of the susceptor 510.

In the plasma processing apparatus 500 of the present embodiment, among the temperature measuring windows 540a through 540d, the temperature measuring window 540d that is provided at the outermost circumferential side of the susceptor 510 is to measure a temperature of the focus ring 535, and the other temperature measuring windows 540a through 540c are to measure a temperature of the wafer W.

Through-holes 545a through 545d are provided in the base plate 525 to correspond to the temperature measuring windows 540a through 540d, and collimators 555a through 555d that are provided at outlet portions of optical fibers 550a through 550d for guiding the measuring light from the measuring system 10 are fixed at the through-holes 545a through 545d.

The optical fibers 550a through 550d are connected to the measuring system 10. The measuring system 10 includes the light source 105, the half mirror 110 transmitting or reflecting the light emitted from the light source 105, and a multiplexer 109 for converting the light transmitted through the half mirror 110 to the four optical fibers 550a through 550d.

The measuring apparatus 150 includes the spectroscope 100 and the controller 120. When four measuring light beams are emitted onto four measuring points of the wafer W, the focus ring 535, and the like, the spectroscope 100 measures interferences between reflected light L1 and reflected light L2 that are reflected respectively by one surface side and a rear surface side of the wafer W or the focus ring 535. The controller 120 measures the temperature of the wafer W and the temperature of the focus ring 535 based on the measurement result. As described above, the photodiode array 108 in the spectroscope 100 is shifted by the piezoelectric device 200 in the array direction during the measuring operation. Accordingly, spectrum data of the wavelength resolution power that is twice or more the number of elements can be obtained according to the measuring system 10 of the present embodiment. Consequently, the temperature of the focus ring 535 having a relatively thick thickness, as well as the temperature of the wafer W, can be measured accurately. As such, by using the measuring system 10 of the present embodiment, the temperatures of the internal parts in the plasma processing apparatus 500 can be measured even when the parts are the relatively thick.

In the above embodiment and the modified example, operations of each of the components are related to each other, and thus the operations may be substituted for a series of operations and a series of processes in consideration of the relations between the operations. Accordingly, the embodiment of the measuring apparatus may be an embodiment of the apparatus for executing the temperature measuring method.

While this invention has been particularly shown and described with reference to exemplary embodiments thereof, it will be understood by those skilled in the art that various changes in form and details may be made therein without departing from the spirit and scope of the invention as defined by the appended claims.

For example, the plasma processing apparatus according to the present invention is not limited to the etching apparatus described in the above embodiments, and may be all kinds of plasma processing apparatuses such as a film forming apparatus, a microwave plasma processing apparatus, and the like. In addition, other apparatuses besides the plasma processing apparatus may be applied provided that there is a heat input in the apparatus.

In addition, the measuring apparatus according to the present invention is particularly advantageous in a frequency range optical coherence tomography. When light reflected by the measuring sample is dispersed by the spectroscope, a limitation in the measurable thickness is defined by the sampling number N and the wavelength span Δw of the spectroscope, and thus the greater the sampling number becomes, the thicker a sample to be measured can be.

The plasma processing apparatus according to the present invention is not limited to the parallel flat plate type plasma processing apparatus described in the above embodiment, and may be applied to any kind of plasma processing apparatus such as an inductively coupled plasma (ICP) processing apparatus, a microwave plasma processing apparatus, and the like.

According to the present invention, the measuring apparatus and the plasma processing apparatus capable of increasing a wavelength resolution power may be provided.

What is claimed is:

1. A measuring apparatus comprising:
    a wavelength dispersion device which receives and disperses light reflected by a front surface of an examination target having a thickness D and light reflected by a rear surface of the examination target;
    a detector in which a plurality of photodetection elements receiving the light dispersed by the wavelength dispersion device and detecting a power of the received light in are provided in an array shape;
    a piezoelectric device which converts an applied voltage into a mechanical power, and shifts the photodetection elements by the mechanical power; and
    a measuring unit which is configured to
        calculate the thickness of the examination target based on a frequency analysis of the light power detected by the photodetection elements in such a state that the photodetection elements are not shifted and the light power detected by the photodetection elements in such a state that the photodetection elements are shifted as much as d/m in an array direction, where d denotes a width of each of the photodetection elements in the array direction, and m denotes an integer equal to or greater than 2, and
        measure a temperature of the examination target based on a previously set relationship between the temperature and the thickness of the examination target.

2. The measuring apparatus of claim 1, wherein the piezoelectric device is attached to an end portion of the plurality of photodetection elements provided in the array shape.

3. The measuring apparatus of claim 1, wherein the detector is a charged coupled device (CCD) array or a photodiode array.

4. The measuring apparatus of claim 1, wherein the measuring apparatus is a Czerny-Turner type spectroscope.

5. The measuring apparatus of claim 1, wherein the measuring unit is configured to measure the temperature of the examination target when a thickness of the examination target is less than a maximum value ($X_{max}$) represented by following equation, $$x_{max} = \frac{3\lambda_0^2}{2\sqrt{\ln 2} \cdot n_{ave}} \cdot \frac{1}{\Delta w/N}$$

where $\lambda_0^2$ denotes a center wavelength of a light source, $n_{ave}$ denotes a refractive index of the examination target, Δw denotes a wavelength span of the measuring apparatus, and N denotes the number of photodetection elements or the sampling number.

6. A plasma processing apparatus comprising:
    a chamber in which a plasma process is performed on a processing target;
    a susceptor on which the processing target is placed in the chamber; and
    a measuring apparatus which measures a temperature of the processing target placed on the susceptor,
    wherein the measuring apparatus comprises:
        a wavelength dispersion device which receives and disperses light reflected by a front surface of the processing target having a thickness D and light reflected by a rear surface of the processing target;
        a detector in which a plurality of photodetection elements receiving the light dispersed by the wavelength dispersion device and detecting a power of the received light in are provided in an array shape;
        a piezoelectric device which converts an applied voltage into a mechanical power, and shifts the photodetection elements by the mechanical power; and
        a measuring unit which is configured to
            calculate the thickness of the processing target based on a frequency analysis of the light power detected by the photodetection elements in such a state that the photodetection elements are not shifted and the light power detected by the photodetection elements in such a state that the photodetection elements are shifted as much as d/m in an array direction, where d denotes a width of each of the photodetection elements in the array direction, and m denotes an integer equal to or greater than 2, and
            measure a temperature of the processing target based on a previously set relationship between the temperature and the thickness of the processing target.

7. A plasma processing apparatus comprising:
    a chamber in which a plasma process is performed on a processing target;
    a susceptor on which the processing target is placed in the chamber; and
    a measuring apparatus which measures a temperature of a member of the plasma processing apparatus, a thickness of the member being larger than a thickness of the processing target,
    wherein the measuring apparatus comprises:
        a wavelength dispersion device which receives and disperses light reflected by a front surface of the member and light reflected by a rear surface of the member;
        a detector in which a plurality of photodetection elements receiving the light dispersed by the wavelength dispersion device and detecting a power of the received light in are provided in an array shape;
        a piezoelectric device which converts an applied voltage into a mechanical power, and shifts the photodetection elements by the mechanical power; and
        a measuring unit which is configured to
            calculate the thickness of the member based on a frequency analysis of the light power detected by the photodetection elements in such a state that the photodetection elements are not shifted and the light power detected by the photodetection elements in such a state that the photodetection elements are shifted as much as d/m in an array direction, where d denotes a width of each of the photodetection elements in the array direction, and m denotes an integer equal to or greater than 2, and measure a temperature of the member based on a previously set relationship between the temperature and the thickness of the member.

* * * * *